United States Patent [19]

Putnam

[11] Patent Number: 5,052,013
[45] Date of Patent: Sep. 24, 1991

[54] PULSED LASER

[76] Inventor: Roger S. Putnam, 1047-B Walnut St., Newton Highlands, Mass. 02161

[21] Appl. No.: 511,287

[22] Filed: Apr. 20, 1990

[51] Int. Cl.[5] .............................................. H01S 3/098
[52] U.S. Cl. ....................................... 372/97; 372/18; 372/68; 372/102
[58] Field of Search ...................... 372/92, 97, 98, 102, 372/108, 9, 10, 11, 18, 68, 23

[56] References Cited

U.S. PATENT DOCUMENTS

| | | | |
|---|---|---|---|
| 3,575,670 | 4/1971 | Hansen | 372/97 X |
| 3,577,093 | 5/1971 | Simpson | 372/97 |
| 3,614,659 | 10/1971 | Rigrod | 372/18 X |
| 3,624,544 | 11/1971 | De Maria et al. | 372/18 |
| 3,626,321 | 12/1971 | Smith et al. | 372/18 X |
| 3,763,441 | 10/1973 | Roess | 372/97 |
| 3,970,963 | 7/1976 | Chester | 372/97 X |
| 4,096,448 | 6/1978 | Hayes | 372/18 |
| 4,649,351 | 3/1987 | Veldkamp et al. | 372/97 X |
| 4,864,577 | 9/1989 | Aoshima et al. | 372/18 |

OTHER PUBLICATIONS

Hayes & Laughman, "Generation of Coherent Optical Pulses," *Applied Optics*, vol. 16, No. 2, Feb. 1977.
Nakazawa et al., "65-Femtosecond Pulse Generation from a Synchronously Pumped Dye Laser Without a Colliding-Pulse Mode-Locking Technique," *Optics Letters*, vol. 12, No. 9, Sep., 1987.
Kuznetsov et al., "Compression of Picosecond Pulses from Diode Lasers using a Modified Grating-Pair Compressor," *Optic Letters*, vol. 15, No. 3, Feb. 1990.

*Primary Examiner*—Frank Gonzalez
*Assistant Examiner*—Galen J. Hansen

[57] ABSTRACT

A pulsed source of laser light (10) includes a diffraction grating (20) that splits light received from a laser output mirror (12) into a plurality of paths that lead to respective laser gain cells ($14_1$, $14_2$, ..., $14_n$). The gain cells individually amplify light components of different respective wavelengths and reflect them back to the diffraction grating (20), which reassembles them into a single beam for transmission to the laser output mirror (12). A mode locker (24), preferably in the form of a saturable absorber, locks the output components into equally spaced frequencies so that the sum of the individual continuous components will be a pulsed signal.

4 Claims, 1 Drawing Sheet

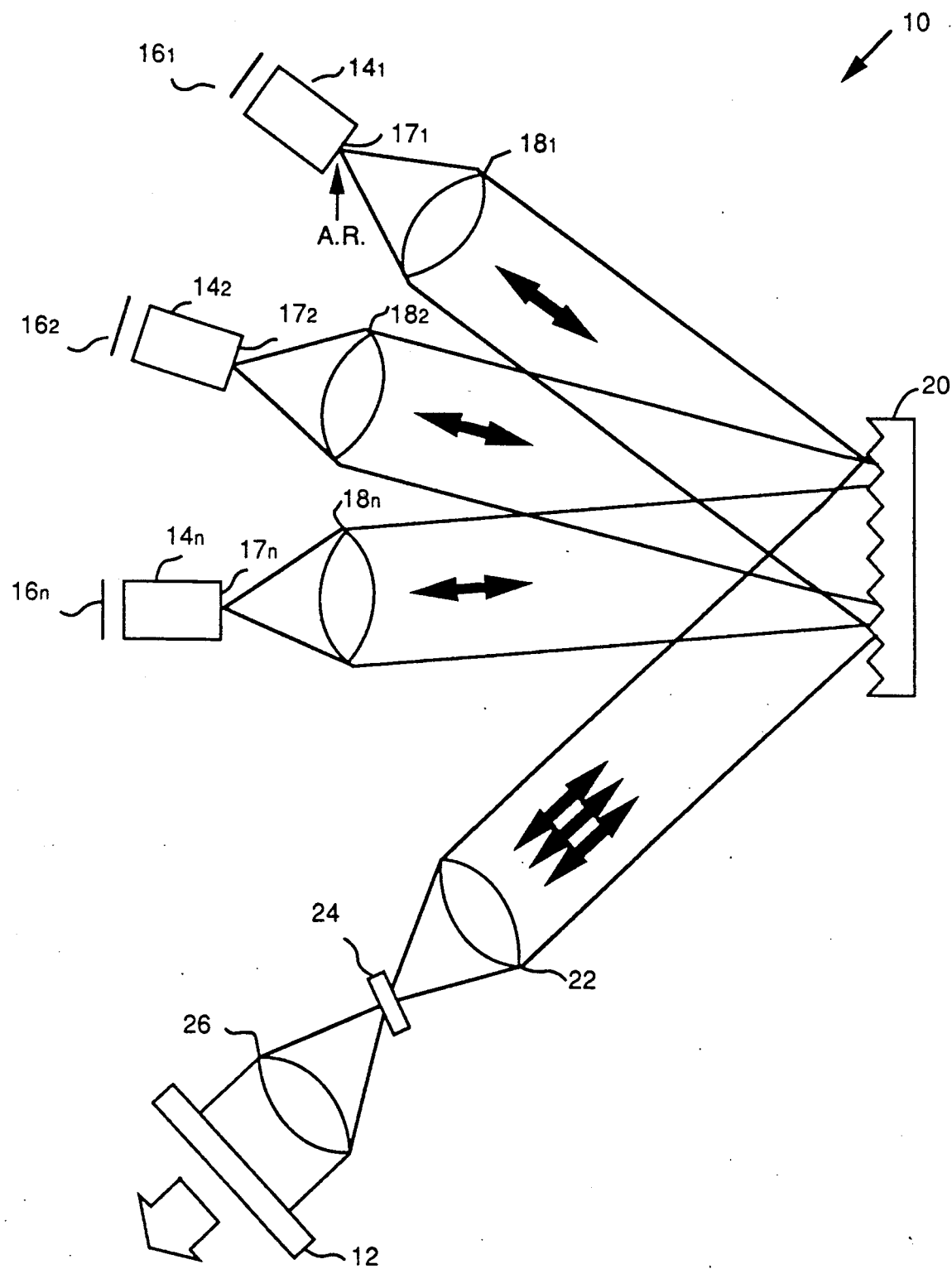

PULSED LASER

BACKGROUND OF THE INVENTION

The present invention is directed to laser technology. It is concerned particularly with the production of short pulses of laser light.

One approach that has been employed in the past for obtaining ultra-short laser pulses is to employ a multi-longitudinal-mode laser. Such a device takes advantage of a plurality of the modes of the laser so as to produce a composite beam of a plurality of different frequencies. If those frequencies are evenly spaced, they will reinforce periodically, with a period equal to the reciprocal of the frequency spacing, to produce pulses even though each mode operates continuously. Such a device can produce pulses at extremely high pulse-repetition rates.

Unfortunately, the multi-mode approach is afflicted with a number of practical difficulties. In the first place, the multi-mode laser is itself relatively expensive. Also, the natural modes are not evenly spaced, and considerable effort must be taken to "drive" them into proper synchronism. That is, the action of the mode locker, whose function is to keep the different modes in the proper relative phases, is resisted by the tendency of the modes to revert to their natural frequencies and thus fall out of the proper phase relationship.

Another problem is that the lasing medium manifests nonlinear effects that cause the modes to interact. Specifically, lasing at one mode tends to reduce the gain at another mode, so the relative amplitudes of the different modes cannot be readily controlled and the bandwidth of the multi-mode laser is effectively reduced. As a consequence, it is difficult to control the pulse shape.

SUMMARY OF THE INVENTION

The present invention makes it possible to avoid many of these limitations. The present invention is a composite laser device that comprises a single laser cavity but separate gain cells—i.e., blocks of lasing material—for the different light wavelengths. A path is provided so that light coming from one end of each of the gain cells coincides at the cavity output mirror, but light reflected back from the output mirror is split in accordance with its wavelength to be returned separately to each of the gain cells. The way in which this is accomplished is to provide a device, such as a diffraction grating, for spatially dispersing the light so that light of different wavelengths traveling from the output mirror to the diffraction grating and striking it at a common incident angle is refracted so as to have maxima at different angles. The different gain cells are positioned with respect to the diffraction grating at those different angles, and the different wavelengths can accordingly be separately tuned by separately adjusting the positions of the gain cells with respect to the diffraction grating. Thus, the "natural modes" can be evenly spaced, as is desired, and much less "forcing" of the frequencies is required of the mode locker.

As a result of this arrangement, the individual gain cells can be simple laser diodes, which are less expensive and easier to operate than other mode-locked lasers. Moreover, the frequency span of the device is determined, not by the effective bandwidth of an individual multi-mode laser, but by the span of available lasing-medium frequencies. This, together with the fact that the amplitudes of the individual wavelengths readily lend themselves to separate control, results in much greater control over the width, spacing, and shape of the resultant pulses.

BRIEF DESCRIPTION OF THE DRAWING

These and further features and advantages of the present invention are described in connection with the accompanying drawing, which is a schematic diagram of a laser system that employs the teachings of the present invention.

DETAILED DESCRIPTION OF AN ILLUSTRATIVE EMBODIMENT

The laser system 10 in the drawing is a device for generating a pulsed output beam, emitted from a conventional laser output half mirror 12. Although the output is pulsed, it is generated through the use of a plurality of gain cells $14_1, 14_2, \ldots, 14_n$ that can be operated in a continuous mode. The pulsed output results from the fact that each of the gain cells 14 operates at a different one of a sequence of evenly spaced frequencies, so that their reinforcement and interference result in pulses whose repetition rate is equal to the uniform separation between the laser frequencies.

In the illustrated embodiment, a separate full mirror $16_1, 16_2, \ldots, 16_n$ is provided for each gain cell 14 and reflects light from its associated gain cell, in the usual manner, back through the gain cell. The other end of each gain cell $14_1, \ldots, 14_n$ is provided with an anti-reflective coating $17_1, 17_2, \ldots, 17_n$. Light then emitted from the other end of each gain cell 14 is collected by a collimating lens $18_1, \ldots, 18_n$, which guides the light to a diffraction grating 20. The gain cells are angularly spaced in such a manner that their respective refraction patterns have a common maximum in the direction that leads to the output mirror 12. A focusing mirror 22 focuses the light of the n frequencies onto a mode locker in the form of a saturable absorber 24, and light that has passed through the saturable absorber 24 is collimated by a further lens 26 and directed to the output mirror 12. Some of the light passes through the output mirror 12 in the conventional manner, while the rest is reflected back in the reverse path.

The saturable absorber is an example of a passive mode locker. As its name suggests, a saturable absorber passes a low percentage of light below a threshold intensity but passes a high percentage above that intensity. As a consequence, the gain of the system is sufficient only for those phases of the various frequencies that periodically reinforce to create a peak intensity that causes the saturable absorber 24 to pass a high proportion of the light that reaches it; other phases are suppressed. The saturable absorber acts to lock the frequencies to a uniform separation that results in the desired pulsing at a rate equal to the common frequency spacing.

The arrangement of the present invention has significant advantages over conventional mode-locked lasers, which force a laser with a single gain cell to operate simultaneously at many of its modal frequencies while requiring the frequencies of these optical modes to be so spaced as to produce pulses periodically. The individual frequencies can easily be separately tuned, simply by adjusting the positions of the different gain cells. This contrasts with single-cell lasers, in which the natural frequencies of the modes are not equally spaced and so resist being frequency and phase locked in the proper manner. In practice, the right frequency spacing can be achieved by simply using a commercially available array of equally spaced laser diodes.

Another advantage is that each load cell can operate at a constant power level and can thus provide a relatively high average power without exceeding its peak-power rating. Additionally, since each gain cell supports only one mode, its gain is not reduced by the production of the other frequencies. The effective bandwidth of the composite laser can be greater than that of any individual cell, and provisions can readily be made to adjust the output of each cell individually, so the shape of the resultant pulses produced at the output mirror 12 can be much more readily controlled.

Moreover, the invention can be practiced in a wide variety of embodiments. For instance, although the drawing depicts a plurality of collimating lenses $18_1$, $18_2, \ldots, 18_n$, these could readily be replaced with a single lens of sufficient diameter. Similarly, an appropriate common mirror could replace the separate mirrors $16_1, 16_2, \ldots, 16_n$.

Additionally, the mode locker 24 does not have to be in the form of a saturable absorber; indeed, although I prefer for reasons of simplicity to employ a passive mode locker, those skilled in the art will recognize that many of the known types of active mode lockers are also applicable. Finally, although a diffraction grating is singularly well suited to use with the present invention, any other device, e.g., a prism, that preferentially forwards to each cell the light of its respective wavelength could in principle be used for the present invention.

It is thus clear that the invention constitutes a significant advance in the art.

I claim:

1. A pulsed laser comprising:
   (a) a plurality of pumped laser gain cells, each gain cell emitting amplified light within a different respective frequency range in first and second opposite directions;
   (b) a corresponding plurality of first mirrors, each mirror disposed to receive the light emitted from or passed through the corresponding gain cell in the first direction, and reflecting the light back through the gain cell;
   (c) a common second mirror, positioned to receive the light emitted by or passed through all of the gain cells in the second direction, reflecting a fraction of the light back to the gain cells and transmitting a fraction thereof;
   (d) a light-dispersing device optically coupling between said common second mirror and each cell said light within the respective frequency range; and
   (e) a mode locker interposed in the path of the light reflected by the common mirror and preferentially transmitting the phases of the respective frequencies that periodically reinforce to produce a high-amplitude pulse, whereby the light transmitted by the common second mirror consists of pulses when the individual gain cells operate continuously.

2. A pulsed laser as defined in claim 1 wherein the light-dispersion means is a diffraction grating.

3. A pulsed laser system as defined in claim 2 wherein the mode locker is a passive mode locker.

4. A pulsed laser system as defined in claim 3 wherein the mode locker is a saturable absorber.

* * * * *